METHOD FOR SELECTIVELY ETCHING SILICON SURFACES

Filed April 18, 1968

INVENTOR.
Terrell B. Koger
BY
Mueller, Aichele, & Rauner
Atty's

United States Patent Office 3,540,955
Patented Nov. 17, 1970

3,540,955
METHOD FOR SELECTIVELY ETCHING SILICON SURFACES

Terrell B. Koger, Mesa, Ariz., assignor to Motorola, Inc., Franklin Park, Ill., a corporation of Illinois Filed Apr. 18, 1968, Ser. No. 722,470
Int. Cl. H01l 7/34
U.S. Cl. 156—17 2 Claims

ABSTRACT OF THE DISCLOSURE

A better definition of patterns is obtained in the selective etching of a silicon wafer by using a platinum-on-silicon dioxide layer as the etch-resistant mask. The mask is formed by selectively etching the oxide in accordance with known procedures, followed by the deposition of platinum over the entire surface including both the oxide and the exposed silicon areas. Then by heating the composite structure to 600° C. to 700° C., a platinum silicide layer is formed covering the areas to be etched. A known silicon etchant may then be used to complete the process, since the platinum silicide and silicon are readily attacked while the pure platinum remains unaffected.

BACKGROUND

This invention relates to the selective etching of silicon, and more particularly to the fabrication of microelectronic structures where selective etching of silicon is employed, for example, to provide air isolation or dielectric isolation surrounding active semiconductor components of an integrated circuit structure.

In the fabrication of microelectronic semiconductor structures, the need frequently arises to remove a precisely defined portion of the semiconductor body by selective eaching. For example, in the fabrication of mesa transistors, the mesa configuration is obtained by depositing a protective mask over that portion of the body to be retained, and then contacting the exposed regions with a suitable etchant.

In the fabrication of integrated circuits, various procedures have been developed for physically and electrically isolating adjacent active components from each other. Whether air isolation or dielectric isolation is to be provided, the first step typically involves the removal of excess semiconductor material surrounding each of the components to be separated. The selective etching step employed for such purposes can be particularly troublesome, since the etch pattern required is unusually deep. It may even be necessary to etch completely through a semiconductor body having a thickness as great as 10 mils. A good definition of deep etch patterns is difficult to obtain with the use of ordinary photoresist resins as a masking material, particularly when etching with mixtures of nitric, hydrofluoric, and acetic acids.

It has been previously proposed to employ an etch-resistant metal film, including platinum, for example, as a mask in the selective etching of silicon. However, it has been necessary to deposit the platinum mask on the silicon surface through an apertured evaporation mask located between the evaporation source and the silicon substrate. Such a method for delineation of the platinum is not sufficiently precise for use in connection with the fabrication of structures which may require etch lines on the order of 1 micron wide.

THE INVENTION

It is an object of the invention to provide an improved method for selectively etching silicon, and more particularly it is an object of the invention to provide an improved method for the use of a platinum mask in the selective etching of silicon.

It is a primary feature of the invention to delineate a platinum mask with the precise definition characteristic of photolithographic methods, without the direct application of such techniques to the platinum film. That is, delineation of the platinum mask is accomplished indirectly by first delineating the desired mask pattern in silicon dioxide or an equivalent layer, using photoresist and selective etching techniques, followed by the deposition of platinum over the entire surface, including the patterned oxide layer and the exposed areas of the silicon body. Thereafter, the definition obtained in the oxide layer is duplicated in the platinum film simply by heating the composite structure to 600° C.–700° C. for a time sufficient to cause interaction of the platinum film with the silicon surface to form platinum silicide.

It is an additional feature of the invention to contact the above modified composite structure with a silicon etchant, for example, a mixture of nitric, hydrofluoric, and acetic acids, whereby the silicide and the silicon are attacked, with the unreacted platinum serving as an etch-resistant mask. In this manner, an etch pattern of up to 10 mils in depth is provided with good definition.

The invention is embodied in a method for selectively etching silicon, beginning with the step of forming a refractory dielectric mask pattern on the silicon surface exposing only the areas to be etched. A film of platinum having a thickness of 1000 to 5000 angstroms is then deposited on the mask and the exposed silicon areas. The composite structure is heated to at least 600° C. for a time sufficient to cause interaction between the platinum film and the silicon areas in contact therewith to form platinum silicide. The structure is then contacted with a silicon etchant whereby the silicide and the silicon are attacked, with the pure platinum serving as an etch-resistant mask.

The step of forming a refractory dielectric pattern on the silicon surface is completed with known procedures. Typically, the dielectric layer will be silicon dioxide formed inherently in conjunction with known fabrication procedures completed prior to the need for selective etching in accordance with the present invention. For example, vapor phase diffusion processes for forming PN junctions within a silicon wafer are typically completed in an oxidizing atmosphere whereby the entire surface of a silicon wafer becomes oxidized to form silicon dioxide as a passivation layer. Silicon nitride is also a useful passivation layer.

The dielectric layer is then patterned with the use of a photoresist composition and a suitable etchant for the dielectric layer, such as hydrogen fluoride in the case of $SiO_2$. Such a pattern is typically formed on the reverse side of a silicon wafer when it is desired to provide air isolation surrounding the active components of a integrated monolithic structure.

A platinum film of 1000 to 5000 angstmos thickness is then deposited over the entire surface of the wafer, including both the areas covered with oxide and the exposed areas of the silicon surface. The platinum is deposited in accordance with known procedures including, for example, vacuum evaporation or sputtering.

After the completion of platinum deposition, the composite structure is subjected to an elevated temperature of 600° C. to 700° C. for a time sufficient to cause interaction between the silicon surface and all portions of the platinum layer in contact therewith. For example, at 650° C., 5 minutes are usually sufficient to form the platinum silicide.

The composite structure is then contacted with a suitable etchant for silicon, such as a mixture of nitric, hydrofluoric, and acetic acids in a volumetric ratio of 5:2:2.

Such an etchant will attack both the platinum silicide and the pure silicon. For deep etching, up to about 10 mils, the time required for etching at 50° C. will be about 2 minutes.

The platinum mask may then be removed by aqua regia. However, if the mask is located on the reverse side of a wafer, it will be advantageous, for many applications, to permit the mask to remain in place. This will facilitate the attachment of the completed structure to a suitable heat sink.

DRAWINGS

Figure 1:
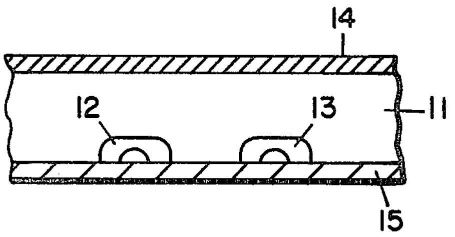
FIG. 1 is a greatly enlarged cross section illustrating a monolithic silicon integrated circuit structure to be selectively etched in accordance with the invention.
Figure 2:
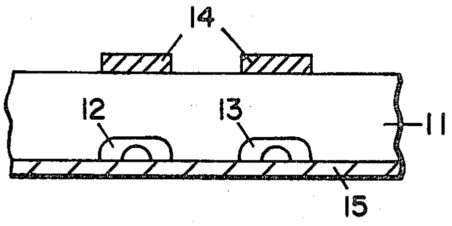
FIGS. 2 through 5 are greatly enlarged cross sections of the structure of FIG. 1 illustrating various intermediate stages in the process of the invention.

The structure of FIG. 1 includes a silicon body 11 provided with diffused regions 12 and 13, and silicon dioxide passivation layers 14 and 15 formed during the diffusion operations. In accordance with one embodiment of the invention, the structure of FIG. 1 is to be provided with dielectric isolation surrounding the active components thereof. As illustrated in FIG. 2, oxide layer 14 is patterned by known procedures to expose all areas of silicon body 11 which are to be etched, and to provide protection for those regions to be retained.

Figure 3:
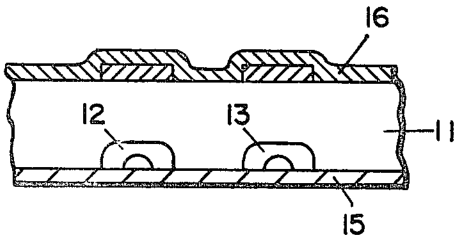
Figure 4:
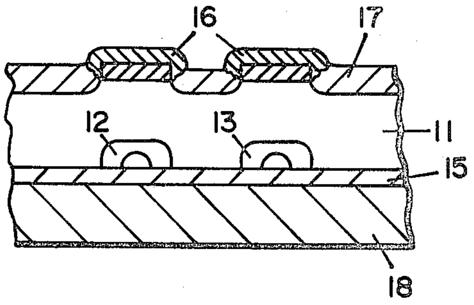

As illustrated in FIG. 3, platinum layer 16 is deposited across the entire surface of the wafer, including the exposed areas of the silicon body and oxide pattern 14. The platinum layer is deposited in accordance with known procedures. As a precaution to ensure good adherence of the platinum to oxide pattern 14, the structure is maintained at a temperature in excess of 200° C. during the deposition. The structure as shown in FIG. 3 is then heated to a temperature of at least 600° C. in order to cause interaction between platinum layer 16 and the surface of silicon body 11 in contact therewith. As a result, platinum silicide layer 17 is formed.

Figure 5:
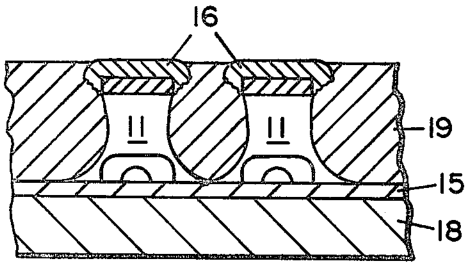
Figure 6:
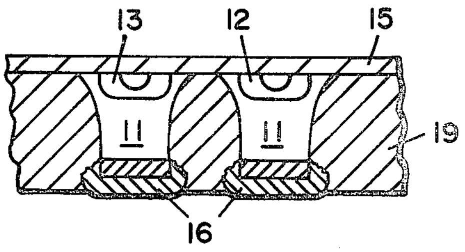
FIG. 6 is a greatly enlarged cross section illustrating the completed structure as produced in accordance with the invention.

At some time prior to the etching operation, a support member 18 is attached to the face of the wafer in order to hold the silicon islands in place after the etching procedure. The structure of FIG. 5 is formed with the use of a silicon etchant, such as a nitric, hydrofluoric, and acetic acid mixture, which readily attacks the silicide and the silicon, leaving the unreacted platinum substantially unaffected. Selective etching is continued until oxide layer 15 is reached. The voids or channels produced by the etching step are then backfilled with a suitable dielectric material 19 thereby providing the desired isolation of the active components of the integrated circuit structure. The completed device is illustrated in FIG. 6 subsequent to removal of support member 18.

In accordance with an alternate embodiment, the structure of FIG. 3 is provided with heavy metallization, having a thickness sufficient to support the entire structure after etching to provide air isolation between active components. The required thickness generally lies in the range of about 0.25 mil to 1.0 mil. Further details of a suitable metallization system for this purpose are disclosed in U.S. Pat. No. 3,335,338. With such metallization, the structure will not require support member 18, and, of course, will not require backfilling with any dielectric substance after etching.

Although the above description is limited to the used of platinum in combination with a refractory dielectric layer to achieve selective etching of a silicon body, it will be apparent that other etch-resistant metals are useful in the method of the invention, including particularly palladium and rhodium. Of course, in addition to etch resistance, the metal must adhere to the dielectric layer and react with the silicon to yield a more readily etchable compound than the pure metal.

I claim:

1. A method for selectively etching silicon surfaces which comprises forming a refractory surface mask to expose only the areas to be etched wherein said mask is selected from the group consisting of silicon oxide and silicon nitride, then depositing a film of platinum on the mask and on the exposed silicon areas, heating the structure to a temperature of from 600° C. to 700° C. for a time sufficient to react the platinum with the silicon thereby forming platinum silicide on the exposed areas, then contacting the structure with a silicon etchant whereby the silicide and the silicon are attacked with the unreacted platinum serving as an etch resistant mask.

2. A method as defined by claim 1 wherein the deposition of platinum is conducted at an elevated temperature to improve its adherence to the mask pattern.

References Cited

UNITED STATES PATENTS

Lepselter: "Beam-Lead Technology," published in The Bell System Technical Journal, February 1966, pp. 233–252.

ROBERT F. BURNETT, Primary Examiner

R. J. ROCHE, Assistant Examiner

U.S. Cl. X.R.

117—217; 29—578, 625